(12) United States Patent
Shiozawa et al.

(10) Patent No.: US 6,707,099 B2
(45) Date of Patent: Mar. 16, 2004

(54) SEMICONDUCTOR DEVICE AND MANUFACTURING METHOD THEREOF

(75) Inventors: Katsuomi Shiozawa, Tokyo (JP); Takashi Kuroi, Tokyo (JP); Katsuyuki Horita, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/218,444

(22) Filed: Aug. 15, 2002

(65) Prior Publication Data

US 2003/0127685 A1 Jul. 10, 2003

(30) Foreign Application Priority Data

Jan. 7, 2002 (JP) .......................................... 2002-000328

(51) Int. Cl.[7] .............................................. H01L 29/792
(52) U.S. Cl. ....................... 257/326; 257/506; 257/632; 257/640; 257/649; 257/324
(58) Field of Search ................................. 257/326, 506, 257/632–640, 649, 324

(56) References Cited

U.S. PATENT DOCUMENTS

| | | | | |
|---|---|---|---|---|
| 6,388,304 B2 | * | 5/2002 | Matsuoka et al. | ........... 257/510 |
| 6,433,372 B1 | * | 8/2002 | Adler et al. | ................. 257/288 |
| 6,515,320 B1 | * | 2/2003 | Azuma et al. | ............... 257/288 |

FOREIGN PATENT DOCUMENTS

| | | | |
|---|---|---|---|
| JP | 61-18148 | * | 1/1986 |
| JP | 62-219916 | * | 9/1987 |
| JP | 6-120332 | | 4/1994 |

OTHER PUBLICATIONS

Nobuhiro Endo, et al. "Scaled CMOS Technology Using SEG Isolation and Buried Well Process" IEEE Transactions on Electron Devices. vol. ED–33. No. 11. Nov. 1986, pp. 1659–1666.

Gerold W. Neudeck, et al. "Novel Silicon Epitaxy for Advanced MOSFET Devices" IEEE. 2000. 2 pages.

* cited by examiner

*Primary Examiner*—Nathan J. Flynn
*Assistant Examiner*—Remmon R. Forde
(74) *Attorney, Agent, or Firm*—Oblon, Spivak, McClelland, Maier & Neustadt, P.C.

(57) ABSTRACT

A semiconductor device less susceptible to inverse narrow channel effect and its manufacturing method are provided. A silicon nitride film (13) is adopted as element isolation regions; the silicon nitride film (13) has a smaller etch rate than a sacrificial silicon oxide film (7) which serves as a sacrificial layer during ion implantation (8). This prevents formation of recesses in the silicon nitride film (13) during the removal of the sacrificial silicon oxide film (7), which weakens the strength of the electric fields at the gate edges. Weakening the strength of the electric fields at the gate edges suppresses the inverse narrow channel effect, so that the MOS transistor offers a characteristic closer to a characteristic in which the threshold voltage keeps a constant value independently of the channel width. Thus an MOS transistor having a good characteristic can be manufactured.

5 Claims, 20 Drawing Sheets

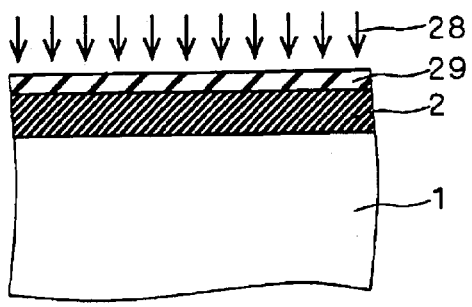
F I G. 45
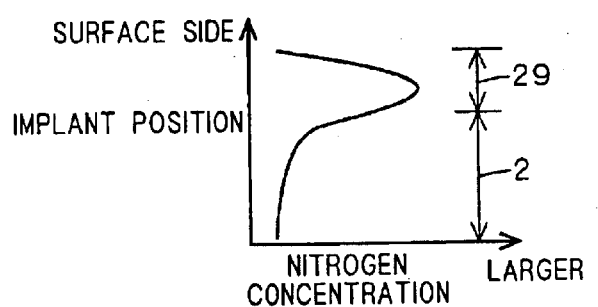
F I G. 46
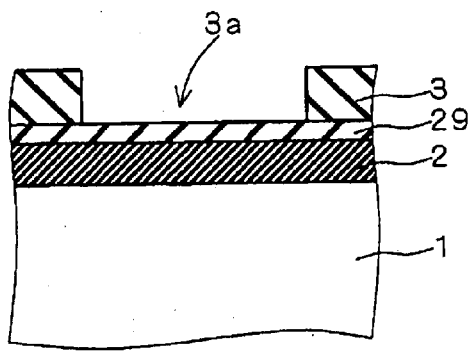
F I G. 47
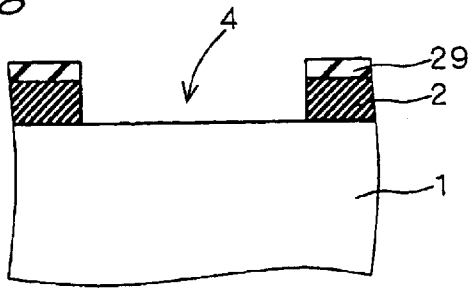
F I G. 48

F I G. 53
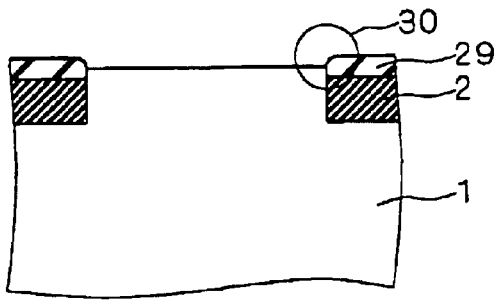
F I G. 54
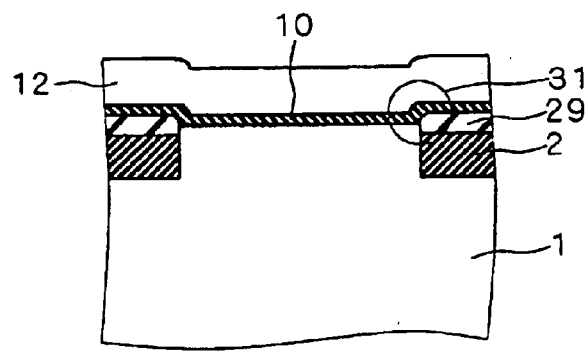
F I G. 55
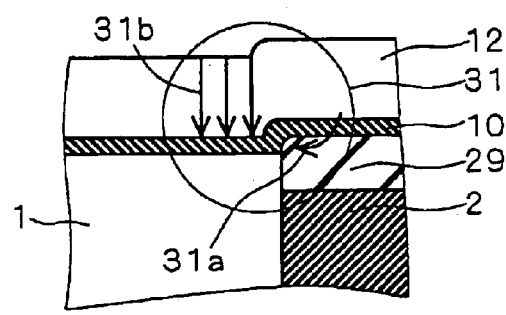
F I G. 56
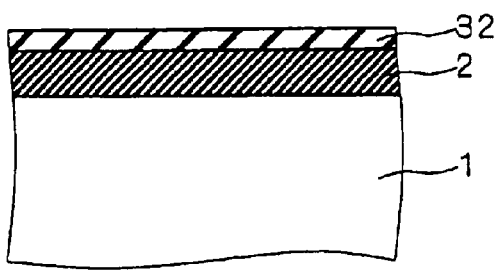

F I G. 77
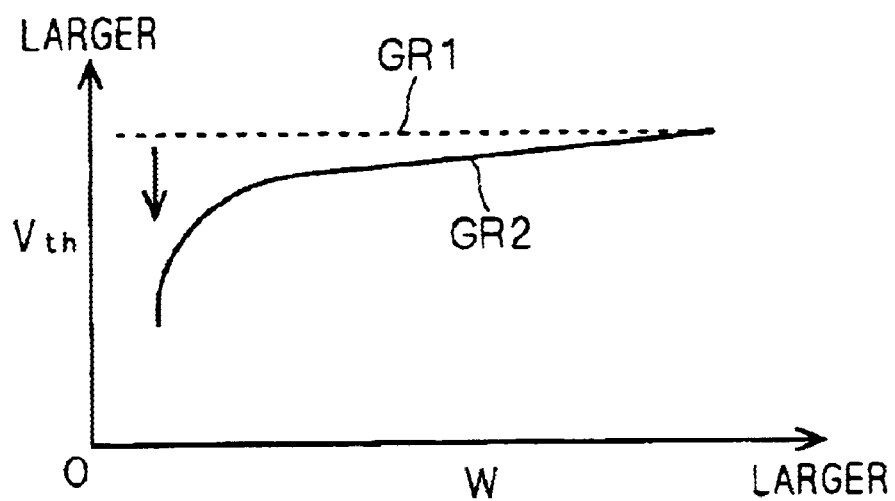

US 6,707,099 B2

SEMICONDUCTOR DEVICE AND MANUFACTURING METHOD THEREOF

BACKGROUND OF THE INVENTION

1. Field of the Invention

The present invention relates to a semiconductor device having element isolation regions and to a manufacturing method thereof.

2. Description of the Background Art

FIGS. 67 to 76 are diagrams that show the process steps of a conventional semiconductor device manufacturing method. Such a manufacturing method is described in, for example, "IEEE Transaction on Electron Devices," Vol. ED-33, No. 11 November 1986, PP. 1659–1666. FIGS. 67 to 76 are all cross-sectional views that show an MOS (Metal Oxide Semiconductor) transistor in the gate width direction.

First, thermal oxidation is applied to the surface of a semiconductor substrate 1, a silicon substrate, to form a silicon oxide film 2 (FIG. 67). Next, photoresist 3 is applied on the silicon oxide film 2. Then, in order to form the active region of the MOS transistor, an opening 3a is formed in the photoresist 3 by using photolithography technique (FIG. 68).

Subsequently, dry etching is selectively applied in the opening 3a by using the photoresist 3 as a mask, so as to remove the part of the silicon oxide film 2 right under the opening 3a. An opening 4 for the formation of the active region is thus formed in the silicon oxide film 2 (FIG. 69). This process step also forms the silicon oxide film 2 as element isolation regions.

Next, an epitaxial silicon layer 5 is formed in the active region formation opening 4 by selective epitaxial growth (FIG. 70). In this process step, the epitaxial silicon layer 5 is formed to a sufficient height (to a level higher than the surface level of the silicon oxide film 2) in the active region formation opening 4. Accordingly the epitaxial silicon layer 5 is somewhat formed also on the silicon oxide film 2.

After that, the surface is etched back or chemical-mechanical-polished (CMP) for planarization of the surface of the epitaxial silicon layer 5 (FIG. 71). A silicon layer 6 for the active region formation is thus formed in the active region formation opening 4. During this planarization process, the silicon oxide film 2 can be used as an etching stopper or a polishing stopper by taking advantage of the etch selectivity or polish selectivity between the epitaxial silicon layer 5 and the silicon oxide film 2.

Next, thermal oxidation is applied to the surface of the active region formation silicon layer 6 to form a sacrificial silicon oxide film 7 (FIG. 72). Then ion implantation 8 for well and channel formation is applied through the sacrificial silicon oxide film 7 (FIG. 73). The sacrificial silicon oxide film 7 is a sacrificed layer which sacrificially undergoes damage during the ion implantation 8, for the active region formation silicon layer 6 and the semiconductor substrate 1.

Then the sacrificial silicon oxide film 7 is removed by wet etching using HF (FIG. 74). Subsequently a silicon oxide film and a polycrystalline silicon film are formed on the surface of the semiconductor substrate 1, which are then patterned to form a gate oxide film 10 and a gate electrode 12 of the MOS transistor (FIG. 75).

According to this conventional semiconductor device manufacturing method, the silicon oxide film 2 is formed into the element isolation regions in the steps of FIGS. 68 and 69 through photolithography and etching techniques. Hence the element isolation regions are free from bird's beaks, as would be caused by LOCOS (Local Oxidation of Silicon), and also free from seams and voids, as would be caused by the trench isolation. The element isolation regions therefore provide good insulation.

In the conventional semiconductor device manufacturing method shown above, however, as shown in FIG. 74, recesses 9 are likely to form in the silicon oxide film 2 during the removal of the sacrificial silicon oxide film 7. The removal of the sacrificial silicon oxide film 7 uses not dry etching but wet etching, so as to prevent further damage. Since the wet etching is isotropic, it is likely to remove the parts of the silicon oxide film 2 which are located at the edges of the sacrificial silicon oxide film 7, thus forming the recesses 9. FIG. 76 is a diagram that shows the region 11 in FIG. 75 in an enlarged manner.

Now, in MOS transistors, it is desired that the channel width W and the threshold voltage Vth be in a relation as shown by the graph GR1 in FIG. 77. That is to say, it is desired that the threshold voltage Vth keep a constant value irrespective of the channel width W.

However, in reality, as shown by the graph GR2 in FIG. 77, the threshold voltage Vth decreases as the channel width W diminishes: this is a so-called inverse narrow channel effect. When the inverse narrow channel effect is noticeable, it reduces the design margin of the MOS transistor. Especially, in devices with reduced dimensions, the threshold Vth greatly varies with dimensional variations, leading to unstable operations of the MOS transistors.

It is thought that the inverse narrow channel effect is caused by influence of the electric fields at the gate edges in the gate-width direction. That is to say, it is supposed that the inverse narrow channel effect becomes more noticeable as the electric fields 11a and 11b at the gate edge in FIG. 76 become stronger.

The recess 9 in the silicon oxide film 2 causes the material of the gate electrode 12 to form in an acute angle in the recess 9, which increases the strength of the electric field 11a upon application of the gate voltage. Accordingly, the conventional semiconductor device manufacturing method shown above results in MOS transistors that are likely to induce the inverse narrow channel effect; the method thus involves difficulties in manufacturing MOS transistors with good characteristics.

SUMMARY OF THE INVENTION

An object of this invention is to provide a semiconductor device which is less likely to induce the inverse narrow channel effect and a manufacturing method thereof.

According to a first aspect of the invention, a semiconductor device includes: a semiconductor substrate; element isolation regions made of a silicon nitride film provided on the semiconductor substrate; and a semiconductor layer formed by epitaxial growth in a region interposed between the element isolation regions on the semiconductor substrate.

A semiconductor device has element isolation regions made of a silicon nitride film provided on a semiconductor substrate and a semiconductor layer formed by epitaxial growth in a region interposed between the element isolation regions on the semiconductor substrate. Accordingly, when a sacrificial layer of silicon oxide film is formed in the surface of the semiconductor layer, ion implantation is applied through the sacrificial layer, and then the sacrificial layer is removed by etching, recesses are less likely to be formed by the etching in the element isolation regions. As a result, when a gate electrode is formed on the surface of the semiconductor layer, the gate electrode is not formed in acute angles on the element isolation regions, and a semiconductor device which is less susceptible to the inverse narrow channel effect can thus be obtained.

According to a second aspect, a semiconductor device includes: a semiconductor substrate; element isolation regions made of a silicon oxynitride film provided on the semiconductor substrate; and a semiconductor layer formed by epitaxial growth in a region interposed between the element isolation regions on the semiconductor substrate.

A semiconductor device has element isolation regions made of a silicon oxynitride film provided on a semiconductor substrate and a semiconductor layer formed by epitaxial growth in a region interposed between the element isolation regions on the semiconductor substrate. Accordingly, when a sacrificial layer of silicon oxide film is formed in the surface of the semiconductor layer, ion implantation is applied through the sacrificial layer, and then the sacrificial layer is removed by etching, recesses are less likely to be formed by the etching in the element isolation regions. As a result, when a gate electrode is formed on the surface of the semiconductor layer, the gate electrode is not formed in acute angles on the element isolation regions, and a semiconductor device less susceptible to the inverse narrow channel effect can thus be obtained. Also, in the case of the silicon oxynitride film, the edges of the element isolation regions are likely to be rounded during the etching to the sacrificial layer. This structure further prevents the inverse narrow channel effect. Moreover, the thermal expansion coefficient of the silicon oxynitride film is closer, than that of the silicon oxide film, to the thermal expansion coefficient of silicon, so that the silicon substrate is subjected to smaller stress than when the silicon oxide film is used.

According to a third aspect, a semiconductor device includes: a semiconductor substrate; element isolation regions provided on the semiconductor substrate; and a semiconductor layer formed by epitaxial growth in a region interposed between the element isolation regions on the semiconductor substrate. The element isolation regions are made of a stacked film composed of a silicon oxide film provided on the semiconductor substrate and a silicon nitride film provided on the silicon oxide film, and the silicon nitride film has a refractive index of 2.0 or more.

The element isolation regions are formed of a stacked film composed of a silicon oxide film provided on the semiconductor substrate and a silicon nitride film provided on the silicon oxide film. The silicon nitride film is thus provided in the surface side of the element isolation regions. Accordingly, when a sacrificial layer of silicon oxide film is formed in the surface of the semiconductor layer, ion implantation is applied through the sacrificial layer, and then the sacrificial layer is removed by etching, recesses are less likely to be formed by the etching in the element isolation regions. As a result, when a gate electrode is formed on the surface of the semiconductor layer, the gate electrode is not formed in acute angles on the element isolation regions, and a semiconductor device less susceptible to the inverse narrow channel effect can thus be obtained. Furthermore, since the silicon nitride film resides in the upper layer, the semiconductor substrate is subjected to reduced stress. The silicon nitride film has a refractive index of 2.0 or greater. The silicon nitride film then offers a smaller etch rate with respect to HF, so that, when the sacrificial layer is removed by etching using HF, recesses are still less likely to be formed by the etching in the element isolation regions.

According to a fourth aspect, a semiconductor device includes: a semiconductor substrate; element isolation regions provided on the semiconductor substrate; and a semiconductor layer formed by epitaxial growth in a region between the element isolation regions on the semiconductor substrate. The element isolation regions are made of a stacked film composed of an undoped silicon oxide film provided on the semiconductor substrate and a silicon oxynitride film provided on the undoped silicon oxide film, and the silicon oxynitride film has a refractive index of 1.7 or more, and less than 2.0.

The element isolation regions are formed of a stacked film composed of an undoped silicon oxide film provided on the semiconductor substrate and a silicon oxynitride film provided on the undoped silicon oxide film. The silicon oxynitride film is thus provided in the surface side of the element isolation regions. Accordingly, when a sacrificial layer of silicon oxide film is formed in the surface of the semiconductor layer, ion implantation is applied through the sacrificial layer, and then the sacrificial layer is removed by etching, recesses are less likely to be formed by the etching in the element isolation regions. As a result, when a gate electrode is formed on the surface of the semiconductor layer, the gate electrode is not formed in acute angles on the element isolation regions, and a semiconductor device less susceptible to the inverse narrow channel effect can thus be obtained. Furthermore, since the silicon oxynitride film resides in the upper layer, the semiconductor substrate is subjected to less stress. The silicon oxynitride film has a refractive index of 1.7 or greater, and smaller than 2.0. The silicon oxynitride film therefore offers a smaller etch rate with respect to HF, so that, when the sacrificial layer is removed by etching using HF, recesses are still less likely to be formed by the etching in the element isolation regions.

According to a fifth aspect, a semiconductor device includes: a semiconductor substrate; element isolation regions provided on the semiconductor substrate; and a semiconductor layer formed by epitaxial growth in a region between the element isolation regions on the semiconductor substrate. The element isolation regions are made of a silicon oxynitride film provided on the semiconductor substrate, and the silicon oxynitride film has a higher nitrogen concentration in its surface-side portion which is distant from the semiconductor substrate than in its portion on the semiconductor substrate side.

The element isolation regions are formed of a silicon oxynitride film provided on the semiconductor substrate, and the nitrogen concentration in its surface-side portion distant from the semiconductor substrate is higher than the nitrogen concentration in its portion on the semiconductor substrate side. Thus the silicon oxynitride film having a higher nitrogen concentration is provided in the surface side of the element isolation regions. Accordingly, when a sacrificial layer of silicon oxide film is formed in the surface of the semiconductor layer, ion implantation is applied through the sacrificial layer, and then the sacrificial layer is removed by etching, the etching is less likely to form recesses in the element isolation regions. As a result, when a gate electrode is formed on the surface of the semiconductor layer, the gate electrode is not formed in acute angles on the element isolation regions, and a semiconductor device less susceptible to the inverse narrow channel effect can thus be obtained. Furthermore, as compared with the silicon oxide film, the silicon oxynitride film has a thermal expansion coefficient closer to that of silicon, so that the silicon substrate is subjected to smaller stress than when the silicon oxide film is used.

These and other objects, features, aspects and advantages of the present invention will become more apparent from the following detailed description of the present invention when taken in conjunction with the accompanying drawings.

BRIEF DESCRIPTION OF THE DRAWINGS

FIG. 45 is a diagram that shows a process step of a semiconductor device manufacturing method according to a seventh preferred embodiment;

FIG. 46 is a diagram that shows the relation between the nitrogen concentration and the implant position in the semiconductor device of the seventh preferred embodiment;

FIGS. 47 to 53 are diagrams that show the process steps of the semiconductor device manufacturing method of the seventh preferred embodiment;

FIG. 54 is a diagram that shows the semiconductor device of the seventh preferred embodiment;

FIG. 55 is a diagram that shows in an enlarged manner a part of the semiconductor device of the seventh preferred embodiment;

FIG. 56 is a diagram that shows a process step of a semiconductor device manufacturing method according to an eighth preferred embodiment;

FIG. 77 is a graph that shows the relation between the channel width W and the threshold voltage Vth in an MOS transistor.

DESCRIPTION OF THE PREFERRED EMBODIMENTS

<First Preferred Embodiment>

This preferred embodiment describes a semiconductor device and a manufacturing method thereof in which a silicon nitride film is adopted as the material of the element isolation regions. When the silicon nitride film is adopted as the material of the element isolation regions, recesses are less likely to be formed in the element isolation regions by etching during a process in which an ion implantation sacrificial layer made of silicon oxide film is removed by etching. As a result, when a gate electrode is formed on the surface of the silicon layer, the gate electrode is not formed in acute angles on the element isolation regions, so that a semiconductor device less susceptible to inverse narrow channel effect can be obtained.

Figure 9:
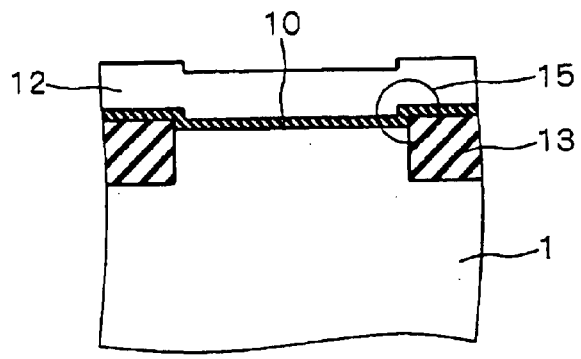
FIG. 9 is a diagram that shows the semiconductor device of the first preferred embodiment.
Figure 10:
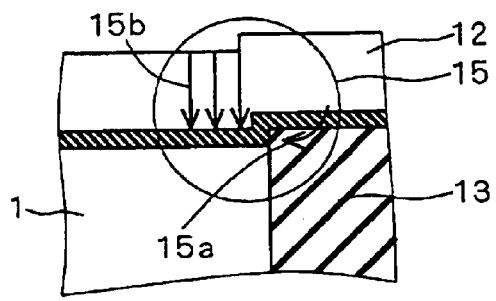
FIG. 10 is a diagram that shows in an enlarged manner a part of the semiconductor device of the first preferred embodiment.

FIGS. 1 to 8 are diagrams that show the process steps of a semiconductor device manufacturing method of this preferred embodiment. FIG. 9 is a diagram that shows the structure of the semiconductor device of the preferred embodiment and FIG. 10 is a diagram that shows in an enlarge manner the region 15 around the edge of an element isolation region in FIG. 9. FIGS. 1 to 10 are all cross-sectional views that show an MOS transistor in the gate width direction.

Figure 1:
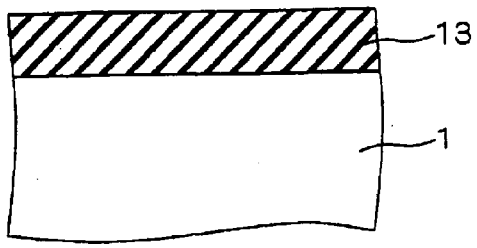
FIGS. 1 to 8 are diagrams that show the process steps of a semiconductor device manufacturing method according to a first preferred embodiment of the present invention.
Figure 2:
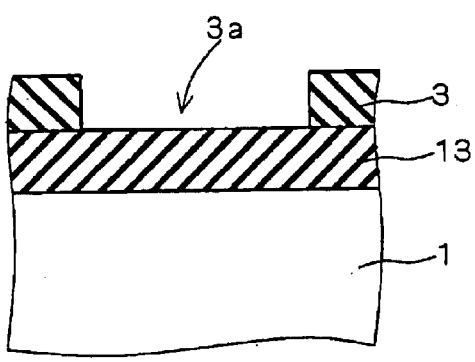

First, a silicon nitride film 13 is deposited by, e.g. CVD (Chemical Vapor Deposition), on the surface of a semiconductor substrate 1, or a silicon substrate (FIG. 1). The silicon nitride film 13 is formed to a thickness of 300 nm, for example. Next, photoresist 3 is applied on the silicon nitride film 13. Then, in order to form the active region of the MOS transistor, an opening 3a is formed in the photoresist 3 by photolithography (FIG. 2).

Figure 3:
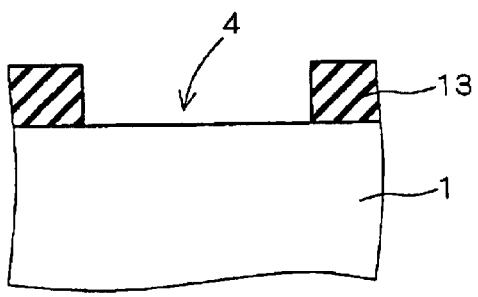

Subsequently, dry etching is selectively applied in the opening 3a by using the photoresist 3 as a mask, so as to remove the part of the silicon nitride film 13 right under the opening 3a. An opening 4 for the formation of the active region is thus formed in the silicon nitride film 13 (FIG. 3). This process step also forms the silicon nitride film 13 as the element isolation regions. For example, the isolation width of the element isolation regions (the width of each of the opposing portions of the silicon nitride film 13) is in the range of 0.1 to several hundred micrometers ($\mu$m), though it depends on the circuit to be constructed.

Figure 4:
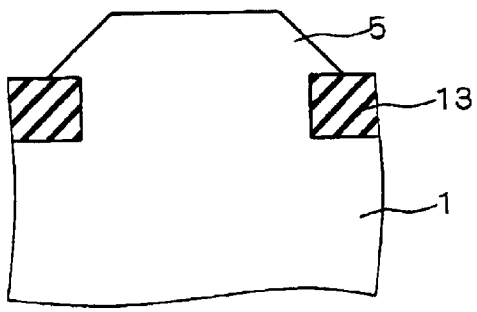

Next, an epitaxial silicon layer 5 is formed in the active region formation opening 4 by selective epitaxial growth (FIG. 4). In this process, the epitaxial silicon layer 5 is formed to a sufficient height in the active region formation opening 4 (to a level higher than the surface level of the silicon nitride film 13, e.g. to a film thickness about twice that of the silicon nitride film 13). Accordingly the epitaxial silicon layer 5 is somewhat formed also on the silicon nitride film 13.

Figure 5:
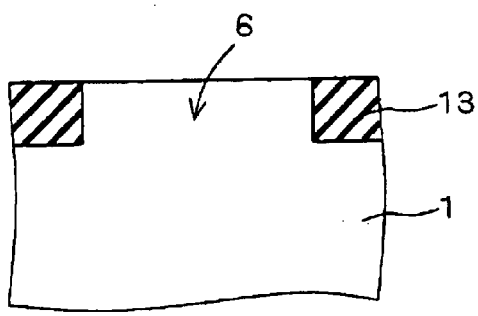

Subsequently, the surface undergoes etchback or CMP for planarization of the surface of the epitaxial silicon layer 5 (FIG. 5). A silicon layer 6 for the formation of the active region is thus formed in the active region formation opening 4. The silicon nitride film 13 has a smaller etch rate and a smaller polish rate than the epitaxial silicon layer 5. Accordingly, during this planarization process, the silicon nitride film 13 can be used as an etching stopper or a polishing stopper by taking advantage of the etch selectivity or polish selectivity between the epitaxial silicon layer 5 and the silicon nitride film 13. This prevents excessive planarization of the epitaxial silicon layer 5.

After the planarization process, the surface of the epitaxial silicon layer 5 is at the same level as, or somewhat lower than, the top surface of the silicon nitride film 13. The difference between the top surface of the silicon nitride film 13 and the surface of the epitaxial silicon layer 5 can be about 0 to −20 nm, for example.

Figure 6:
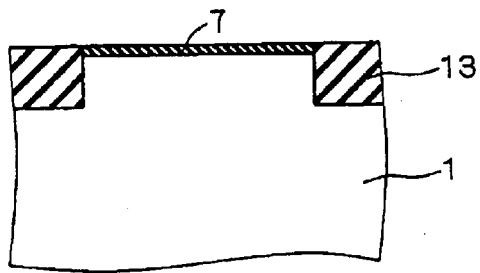
Figure 7:
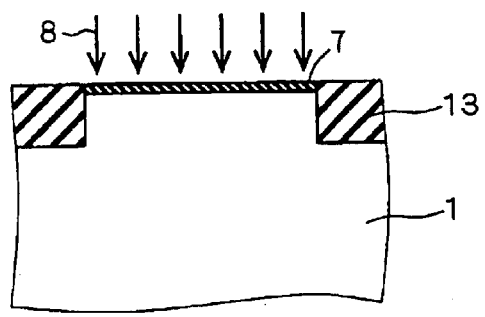

Next, thermal oxidation is applied to the surface of the active region formation silicon layer 6 to form a sacrificial silicon oxide film 7 (FIG. 6). Then ion implantation 8 for well and channel formation is applied through the sacrificial silicon oxide film 7 (FIG. 7). The sacrificial silicon oxide film 7 is a sacrificed layer which sacrificially undergoes damage during the ion implantation 8 for the active region formation silicon layer 6 and the semiconductor substrate 1.

Figure 8:
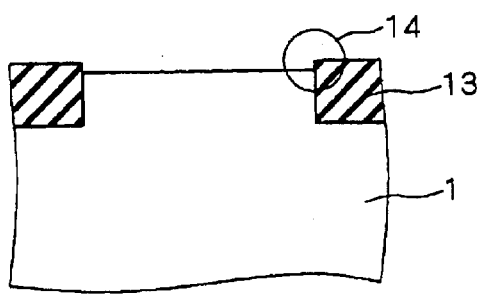

Then the sacrificial silicon oxide film 7 is removed by wet etching using HF (FIG. 8). The silicon nitride film 13 has a smaller etch rate than the sacrificial silicon oxide film 7. Accordingly, during the removal of the sacrificial silicon oxide film 7, recesses will not be caused by the etching in the vicinities of the edges 14 of the element isolation regions. As a result, when a gate electrode is formed on the surface of the active region formation silicon layer 6, the gate electrode is not formed in acute angles on the element isolation regions, and a semiconductor device less likely to induce the inverse narrow channel effect can thus be manufactured.

After that, a silicon oxide film and a polycrystalline silicon film are formed on the surface of the semiconductor substrate 1, which are then patterned to form a gate oxide film 10 and a gate electrode 12 of the MOS transistor (FIG. 9). The semiconductor device of this preferred embodiment is thus obtained.

The semiconductor device of this preferred embodiment adopts, as the element isolation regions, the silicon nitride film 13 which has a smaller etch rate than the sacrificial silicon oxide film 7. This prevents formation of recesses in the silicon nitride film 13, as shown in FIG. 10, during the removal of the sacrificial silicon oxide film 7. Thus the strength of the electric field 15a at the gate edge is weakened.

Weakening the strength of the electric field 15a suppresses the inverse narrow channel effect, so that the MOS transistor can provide a characteristic closer to that shown by the graph GR1 in FIG. 77. This preferred embodiment thus enables the manufacture of an MOS transistor having a good characteristic.

<Second Preferred Embodiment>

This preferred embodiment is a variation of the semiconductor device manufacturing method of the first preferred embodiment. In this manufacturing method, isotropic etching is applied to the element isolation regions to narrow the isolation width of the element isolation regions.

The minimum isolation width of the silicon nitride film 13 serving as the element isolation regions is defined by the wavelength of the light source used in the photolithography process. Therefore, when finer element isolation regions are desired, the isolation width can be reduced only to a limited degree through the application of the photolithography technique.

Accordingly, in this preferred embodiment, isotropic etching is applied to the silicon nitride film 13 before formation of the epitaxial silicon layer 5, so as to narrow the isolation width.

Figure 11:
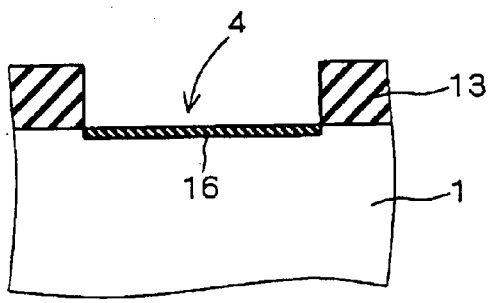
FIGS. 11 and 12 are diagrams that show process steps of a semiconductor device manufacturing method according to a second preferred embodiment.
Figure 12:
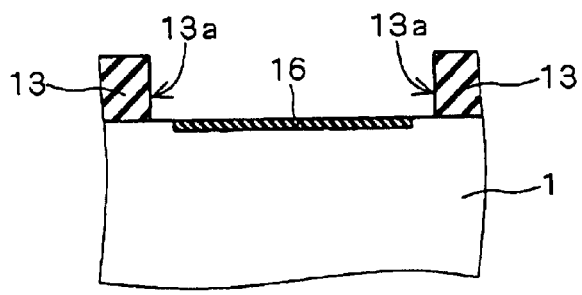

FIGS. 11 and 12 are diagrams that show a semiconductor device manufacturing method of this preferred embodiment. First, the manufacturing process is performed to the step shown in FIG. 3 according to the semiconductor device manufacturing method of the first preferred embodiment. Next, as shown in FIG. 11, an etching protection film 16 is provided on the semiconductor substrate in the region between the opposing portions of the silicon nitride film 13, i.e. in the active region formation opening 4. This etching protection film 16 is a film for protecting the semiconductor substrate 1 in the active region formation opening 4 so that the semiconductor substrate 1 will not be damaged during the isotropic etching to the silicon nitride film 13. For the etching protection film 16, a material which has a satisfactory etch selectivity with respect to the silicon nitride film 13 can be adopted (e.g. silicon oxide film).

Then isotropic etching 13a is applied to the silicon nitride film 13 through, e.g. wet etching with thermal phosphoric acid (FIG. 12). The isolation width of the silicon nitride film 13 is thus reduced.

After that, the etching protection film 16 is removed (in the case of silicon oxide film, it is removed with HF), which is followed by the process step of FIG. 4 and the subsequent steps according to the semiconductor device manufacturing method of the first preferred embodiment.

According to this preferred embodiment, the element isolation regions are isotropically etched to reduce the isolation width of the element isolation regions. This enables the formation of finer element isolation regions.

Further, the etching protection film 16 is formed in the active region formation opening 4 before the isotropic etching. Therefore, during the isotropic etching, the etching protection film 16 protects the semiconductor substrate 1 in the active region formation opening 4 and prevents damage to the semiconductor substrate 1.

<Third Preferred Embodiment>

This preferred embodiment is a variation of the first preferred embodiment; a silicon oxynitride film is adopted in place of the silicon nitride film 13 used in the first preferred embodiment.

Figure 21:
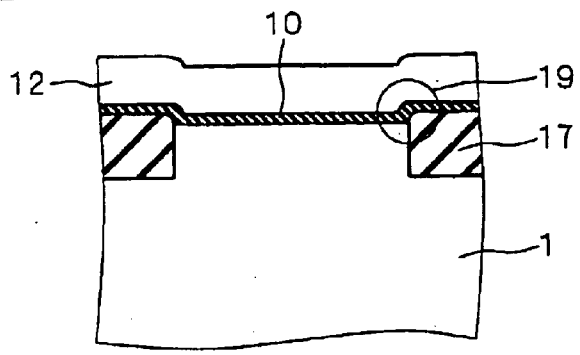
FIG. 21 is a diagram that shows the semiconductor device of the third preferred embodiment.
Figure 22:
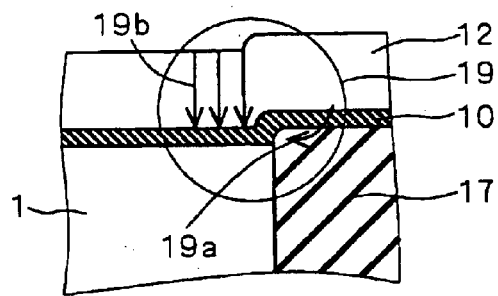
FIG. 22 is a diagram that shows in an enlarged manner a part of the semiconductor device of the third preferred embodiment.

FIGS. 13 to 20 are diagrams that show the process steps of a semiconductor device manufacturing method of this preferred embodiment. FIG. 21 is a diagram that shows the structure of the semiconductor device of this preferred embodiment and FIG. 22 is a diagram that shows in an enlarged manner the region 19 around the edge of an element isolation region in FIG. 21. FIGS. 13 to 22 are all cross-sectional views that show an MOS transistor in the gate width direction.

Figure 13:
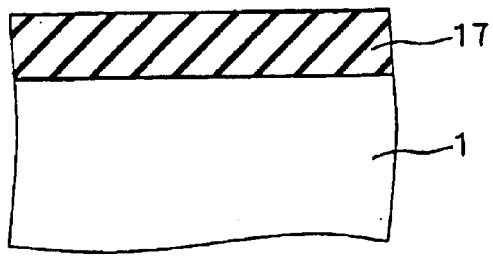
FIGS. 13 to 20 are diagrams that show the process steps of a semiconductor device manufacturing method according to a third preferred embodiment.
Figure 14:
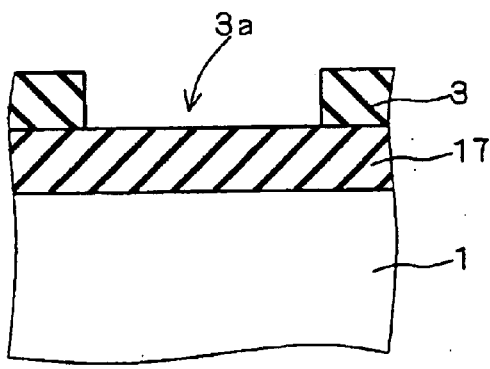

First, a silicon oxynitride film 17 is deposited by, e.g. CVD, on the surface of the semiconductor substrate 1 or silicon substrate (FIG. 13). The silicon oxynitride film 17 is formed to a thickness of 300 nm, for example. Next, the photoresist 3 is applied on the silicon oxynitride film 17. Then the opening 3a is formed in the photoresist 3 by photolithography (FIG. 14).

Figure 15:
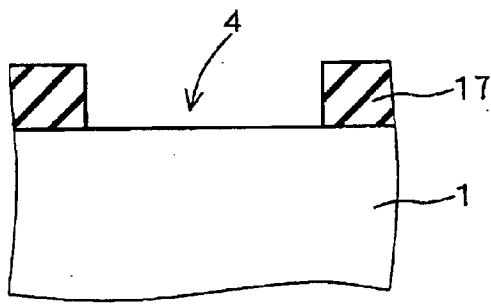

Subsequently, dry etching is selectively applied in the opening 3a by using the photoresist 3 as a mask, so as to remove the part of the silicon oxynitride film 17 right under the opening 3a, thereby forming the active region formation opening 4 (FIG. 15). This process step also forms the silicon oxynitride film 17 as the element isolation regions. For example, the isolation width of the element isolation regions (the width of each of the opposing portions of the silicon oxynitride film 17) is in the range of 0.1 to several hundred micrometers (μm), though it depends on the circuit to be constructed.

Figure 16:
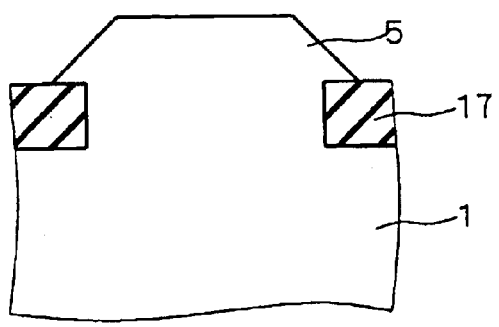

Next, the epitaxial silicon layer 5 is formed in the active region formation opening 4 by selective epitaxial growth (FIG. 16). In this process, the epitaxial silicon layer 5 is formed to a sufficient height in the active region formation opening 4 (to a level higher than the surface level of the silicon oxynitride film 17, e.g. to a film thickness about twice that of the silicon oxynitride film 17). Accordingly the epitaxial silicon layer 5 is somewhat formed also on the silicon oxynitride film 17.

Figure 17:
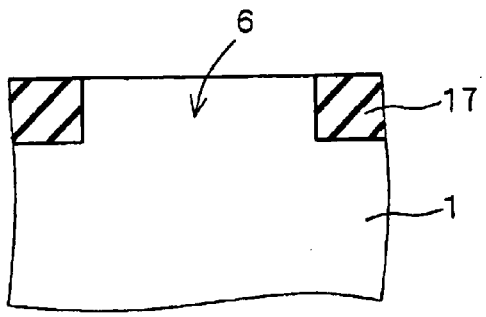

Subsequently, the surface undergoes etchback or CMP for planarization of the surface of the epitaxial silicon layer 5 (FIG. 17). The active region formation silicon layer 6 is thus formed in the active region formation opening 4. The silicon oxynitride film 17 has a smaller etch rate and a smaller polish rate than the epitaxial silicon layer 5. Accordingly, during this planarization process, the silicon oxynitride film 17 can be used as an etching stopper or a polishing stopper by taking advantage of the etch selectivity or polish selectivity between the epitaxial silicon layer 5 and the silicon oxynitride film 17. This prevents excessive planarization of the epitaxial silicon layer 5.

After the planarization process, the surface of the epitaxial silicon layer 5 is at the same level as, or somewhat lower than, the top surface of the silicon oxynitride film 17. The difference between the top surface of the silicon oxynitride film 17 and the surface of the epitaxial silicon layer 5 can be about 0 to −20 nm, for example.

Figure 18:
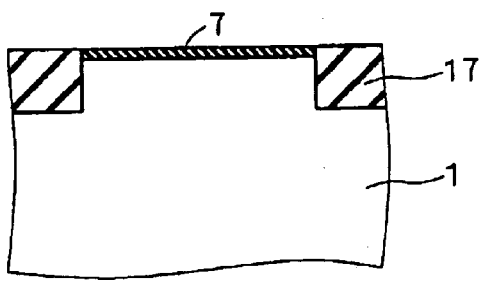
Figure 19:
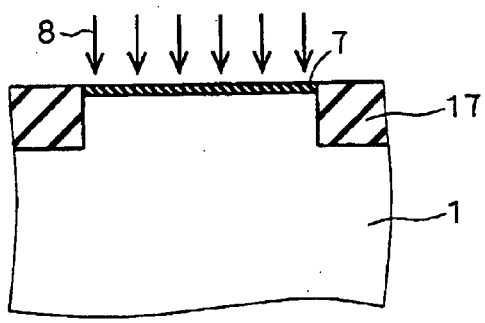

Next, thermal oxidation is applied to the surface of the active region formation silicon layer 6 to form the sacrificial silicon oxide film 7 (FIG. 18). Then the ion implantation 8 for well and channel formation is applied through the sacrificial silicon oxide film 7 (FIG. 19).

Figure 20:
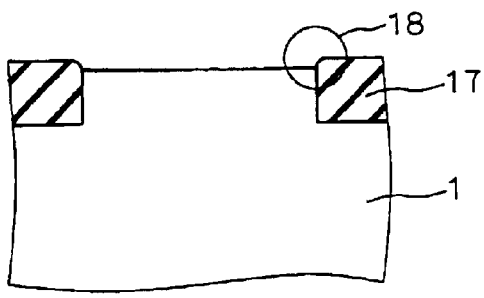

Then the sacrificial silicon oxide film 7 is removed by wet etching using HF (FIG. 20). The silicon oxynitride film 17 has a smaller etch rate than the sacrificial silicon oxide film 7. Accordingly, during the removal of the sacrificial silicon oxide film 7, recesses will not be formed by the etching in the vicinities of the edges 18 of the element isolation regions. As a result, when a gate electrode is formed on the surface of the active region formation silicon layer 6, the gate electrode is not formed in acute angles on the element isolation regions, and a semiconductor device less likely to induce the inverse narrow channel effect can thus be manufactured.

After that, a silicon oxide film and a polycrystalline silicon film are formed on the surface of the semiconductor substrate 1, which are then patterned to form the gate oxide film 10 and the gate electrode 12 of the MOS transistor (FIG. 21). The semiconductor device of this preferred embodiment is thus obtained.

The semiconductor device of this preferred embodiment adopts, as the element isolation regions, the silicon oxynitride film 17 which has a smaller etch rate than the sacrificial silicon oxide film 7. This prevents formation of recesses in the silicon oxynitride film 17, as shown in FIG. 22, during the removal of the sacrificial silicon oxide film 7. Thus the strength of the electric field 19a at the gate edge is weakened.

Weakening the strength of the electric field 19a suppresses the inverse narrow channel effect, so that the MOS transistor offers a characteristic closer to that shown by the graph GR1 in FIG. 77. This preferred embodiment thus enables the manufacture of an MOS transistor having a good characteristic.

Furthermore, in the case of the silicon oxynitride film 17, as shown in FIG. 22, the edges of the element isolation regions are likely to be rounded during the etching to the sacrificial silicon oxide film 7. This structure further prevents the inverse narrow channel effect.

Moreover, as compared with the silicon oxide film, the silicon oxynitride film has a thermal expansion coefficient which is closer to that of silicon, so that the stress to the silicon substrate can be smaller than when the silicon oxide film is used.

<Fourth Preferred Embodiment>

This preferred embodiment is a variation of the semiconductor device manufacturing method of the third preferred embodiment. In this manufacturing method, isotropic etching is applied to the element isolation regions to narrow the isolation width of the element isolation regions. In this preferred embodiment, as in the second preferred embodiment, isotropic etching is applied to the silicon oxynitride film 17 before formation of the epitaxial silicon layer 5, so as to narrow the isolation width.

Figure 23:
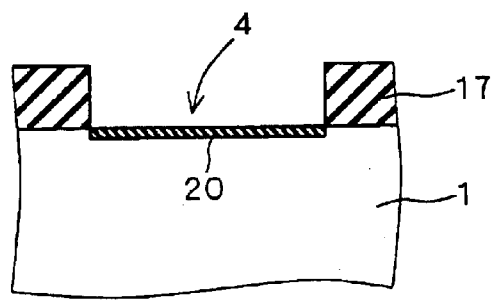
FIGS. 23 and 24 are diagrams that show process steps of a semiconductor device manufacturing method according to a fourth preferred embodiment.
Figure 24:
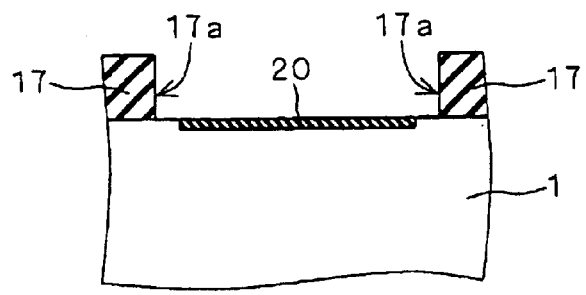

FIGS. 23 and 24 are diagrams that show a semiconductor device manufacturing method of this preferred embodiment. First, the manufacturing process is performed to the step shown in FIG. 15 according to the semiconductor device manufacturing method of the third preferred embodiment. Next, as shown in FIG. 23, an etching protection film 20 is provided on the semiconductor substrate 1 in the region between the opposing portions of the silicon oxynitride film 17, i.e. in the active region formation opening 4. This etching protection film 20 is a film for protecting the semiconductor substrate 1 in the active region formation opening 4 so that the semiconductor substrate 1 will not be damaged during the isotropic etching to the silicon oxynitride film 17. For the etching protection film 20, too, a material which has a satisfactory etch selectivity with respect to the silicon oxynitride film 17 can be adopted (e.g. silicon oxide film).

Then isotropic etching 17a is applied to the silicon oxynitride film 17 through, e.g. wet etching with thermal phosphoric acid (FIG. 24). The isolation width of the silicon oxynitride film 17 is thus reduced.

After that, the etching protection film 20 is removed (in the case of silicon oxide film, it is removed with HF), which is followed by the process step of FIG. 16 and the subsequent steps according to the semiconductor device manufacturing method of the third preferred embodiment.

According to this preferred embodiment, the element isolation regions are isotropically etched to reduce the isolation width of the element isolation regions. This enables the formation of finer element isolation regions.

Further, the etching protection film 20 is formed in the active region formation opening 4 before the isotropic etching. Therefore, during the isotropic etching, the etching protection film 20 protects the semiconductor substrate 1 in the active region formation opening 4 and prevents damage to the semiconductor substrate 1.

<Fifth Preferred Embodiment>

This preferred embodiment is also a variation of the first preferred embodiment; a stacked film composed of a silicon oxide film and a silicon nitride film is adopted in place of the silicon nitride film 13 used in the first preferred embodiment.

Figure 33:
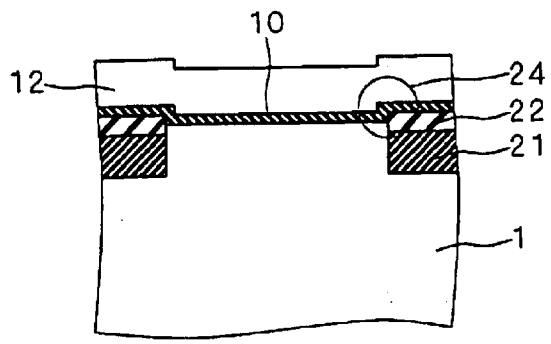
FIG. 33 is a diagram that shows the semiconductor device of the fifth preferred embodiment.
Figure 34:
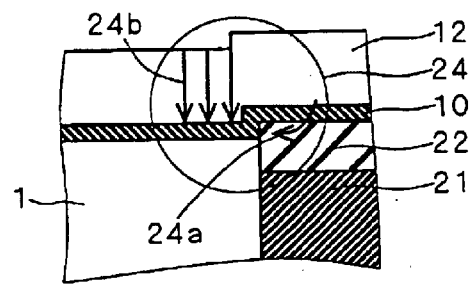
FIG. 34 is a diagram that shows in an enlarged manner a part of the semiconductor device of the fifth preferred embodiment.

FIGS. 25 to 32 are diagrams that show the process steps of a semiconductor device manufacturing method of this preferred embodiment. FIG. 33 is a diagram that shows the structure of the semiconductor device of this preferred embodiment and FIG. 34 is a diagram that shows in an enlarged manner the region 24 around the edge of an element isolation region in FIG. 33. FIGS. 25 to 34 are all cross-sectional views that show an MOS transistor in the gate width direction.

Figure 25:
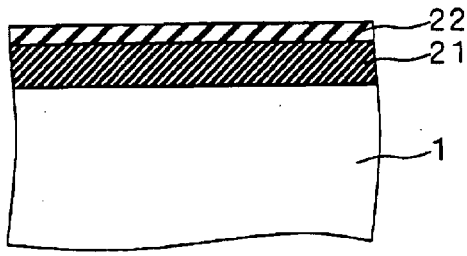
FIGS. 25 to 32 are diagrams that show the process steps of a semiconductor device manufacturing method according to a fifth preferred embodiment of the present invention.
Figure 26:
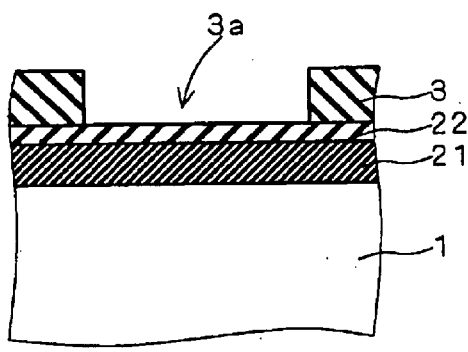

First, a silicon oxide film 21 is deposited by, e.g. CVD, on the surface of the semiconductor substrate 1 or silicon substrate, and then a silicon nitride film 22 is further deposited by, e.g. CVD (FIG. 25). The stacked film composed of the silicon oxide film 21 and the silicon nitride film 22 is formed to a thickness of 300 nm, for example. Next, the photoresist 3 is applied on the stacked film. Then the opening 3a is formed in the photoresist 3 by photolithography (FIG. 26).

Figure 27:
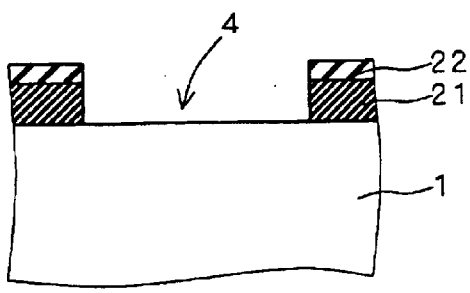

Subsequently, dry etching is selectively applied in the opening 3a by using the photoresist 3 as a mask, so as to remove the part of the stacked film right under the opening 3a, thereby forming the active region formation opening 4 (FIG. 27). This process step also forms the stacked film as the element isolation regions. For example, the isolation width of the element isolation regions (the width of each of the opposing portions of the stacked film) is in the range of 0.1 to several hundred micrometers ($\mu$m), though it depends on the circuit to be constructed.

Figure 28:
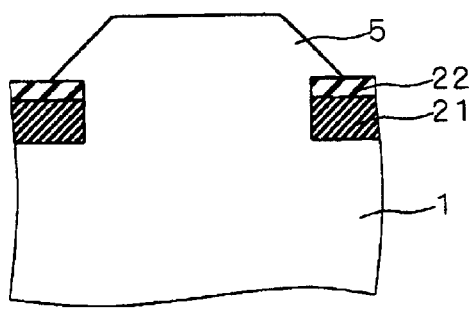

Next, the epitaxial silicon layer 5 is formed in the active region formation opening 4 by selective epitaxial growth (FIG. 28). In this process, the epitaxial silicon layer 5 is formed to a sufficient height in the active region formation opening 4 (to a level higher than the surface level of the stacked film, e.g. to a film thickness about twice that of the stacked film). Accordingly the epitaxial silicon layer 5 is somewhat formed also on the stacked film.

Figure 29:
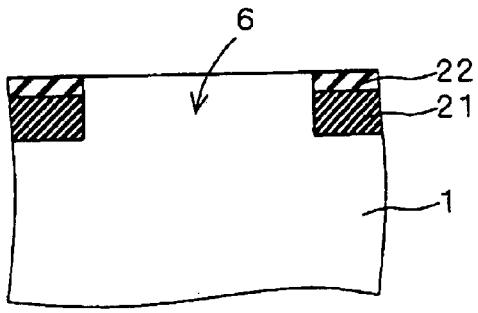

Subsequently, the surface undergoes etchback or CMP for planarization of the surface of the epitaxial silicon layer 5 (FIG. 29). The active region formation silicon layer 6 is thus formed in the active region formation opening 4. The silicon nitride film 22 has a smaller etch rate and a smaller polish rate than the epitaxial silicon layer 5. Accordingly, during this planarization process, the silicon nitride film 22 can be used as an etching stopper or a polishing stopper by taking advantage of the etch selectivity or polish selectivity between the epitaxial silicon layer 5 and the silicon nitride film 22. This prevents excessive planarization of the epitaxial silicon layer 5.

After the planarization process, the surface of the epitaxial silicon layer 5 is at the same level as, or somewhat lower than, the top surface of the silicon nitride film 22. The difference between the top surface of the silicon nitride film 22 and the surface of the epitaxial silicon layer 5 can be about 0 to −20 nm, for example.

Figure 30:
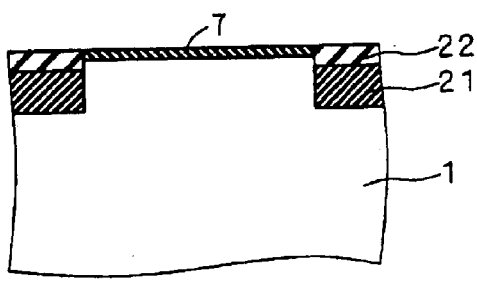
Figure 31:
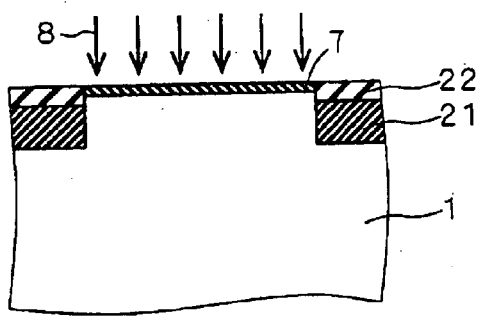

Next, thermal oxidation is applied to the surface of the active region formation silicon layer 6 to form the sacrificial silicon oxide film 7 (FIG. 30). Then the ion implantation 8 for well and channel formation is applied through the sacrificial silicon oxide film 7 (FIG. 31).

Figure 32:
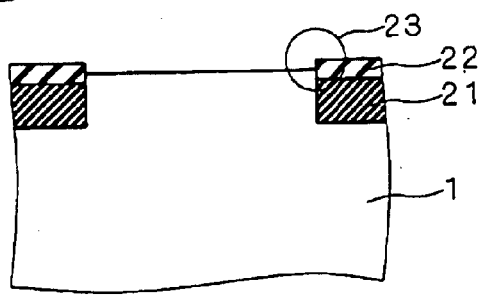

Then the sacrificial silicon oxide film 7 is removed by wet etching using HF (FIG. 32). In the element isolation regions, the silicon nitride film 22, which is located on the surface side away from the semiconductor substrate 1, has a smaller etch rate than the sacrificial silicon oxide film 7. Accordingly, during the removal of the sacrificial silicon oxide film 7, recesses will not be formed by the etching in the vicinities of the edges 23 of the element isolation regions. As a result, when a gate electrode is formed on the surface of the active region formation silicon layer 6, the gate electrode is not formed in acute angles on the element isolation regions, and a semiconductor device less likely to induce the inverse narrow channel effect can thus be manufactured.

After that, a silicon oxide film and a polycrystalline silicon film are formed on the surface of the semiconductor substrate 1, which are then patterned to form the gate oxide film 10 and the gate electrode 12 of the MOS transistor (FIG. 33). The semiconductor device of this preferred embodiment is thus obtained.

The semiconductor device of this preferred embodiment adopts, as the element isolation regions, the stacked film which has on its surface side the silicon nitride film 22 having a smaller etch rate than the sacrificial silicon oxide film 7. This prevents formation of recesses in the stacked film, as shown in FIG. 34, during the removal of the sacrificial silicon oxide film 7. Thus the strength of the electric field 24a at the gate edge is weakened.

Weakening the strength of the electric field 24a suppresses the inverse narrow channel effect, so that the MOS transistor offers a characteristic closer to that shown by the graph GR1 in FIG. 77. This preferred embodiment thus enables the manufacture of an MOS transistor having a good characteristic.

Furthermore, in this preferred embodiment, the silicon nitride film 22 resides only in the upper layer in the element isolation regions. Therefore the semiconductor substrate 1 is subjected to reduced stress.

A refractive index of 2.0 or more is satisfactory for the silicon nitride film 22. Then the silicon nitride film 22 offers a small etch rate with respect to HF, so that the element isolation regions are less likely to be recessed during the removal of the sacrificial silicon oxide film 7 with HF.

<Sixth Preferred Embodiment>

This preferred embodiment is a variation of the fifth preferred embodiment; a stacked film composed of the silicon oxide film 21 and a silicon oxynitride film is adopted in place of the stacked film composed of the silicon oxide film 21 and the silicon nitride film 22 used in the fifth preferred embodiment.

Figure 43:
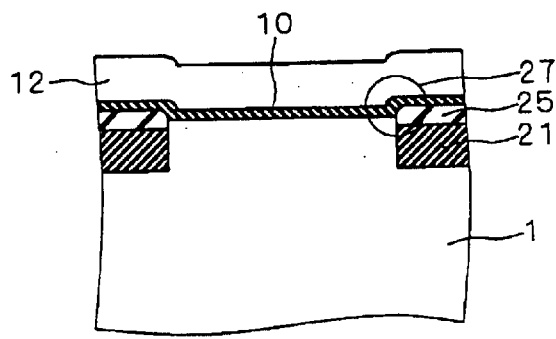
FIG. 43 is a diagram that shows the semiconductor device of the sixth preferred embodiment.
Figure 44:
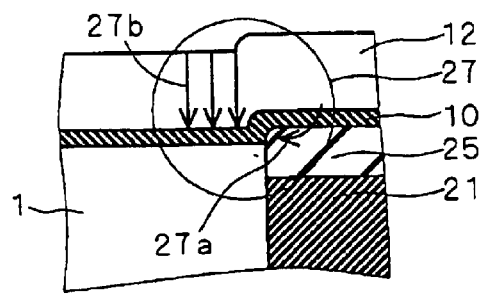
FIG. 44 is a diagram that shows in an enlarged manner a part of the semiconductor device of the sixth preferred embodiment.

FIGS. 35 to 42 are diagrams that show the process steps of a semiconductor device manufacturing method of this preferred embodiment. FIG. 43 is a diagram that shows the structure of the semiconductor device of this preferred embodiment and FIG. 44 is a diagram that shows in an enlarged manner the region 27 around the edge of an element isolation region in FIG. 43. FIGS. 35 to 44 are all cross-sectional views that show an MOS transistor in the gate width direction.

Figure 35:
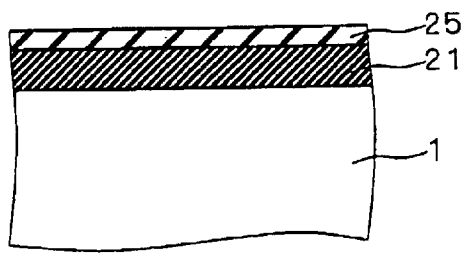
FIGS. 35 to 42 are diagrams that show the process steps of a semiconductor device manufacturing method according to a sixth preferred embodiment of the present invention.
Figure 36:
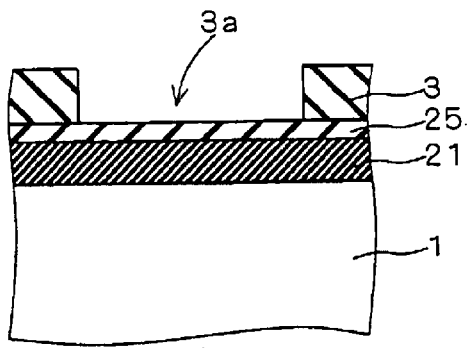

First, the silicon oxide film 21 is deposited by, e.g. CVD, on the surface of the semiconductor substrate 1 or silicon substrate, and a silicon oxynitride film 25 is further deposited by, e.g. CVD (FIG. 35). The stacked film composed of the silicon oxide film 21 and the silicon oxynitride film 25 is formed to a thickness of 300 nm, for example. Next, the photoresist 3 is applied on the stacked film. Then the opening 3a is formed in the photoresist 3 by photolithography (FIG. 36).

Figure 37:
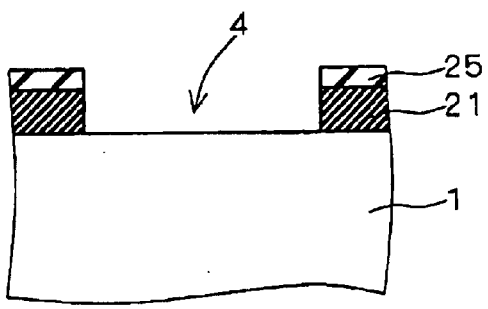

Subsequently, dry etching is selectively applied in the opening 3a by using the photoresist 3 as a mask, so as to remove the part of the stacked film right under the opening 3a, thereby forming the active region formation opening 4 (FIG. 37). This process step also forms the stacked film as the element isolation regions. For example, the isolation width of the element isolation regions (the width of each of the opposing portions of the stacked film) is in the range of 0.1 to several hundred micrometers ($\mu$m), though it depends on the circuit to be constructed.

Figure 38:
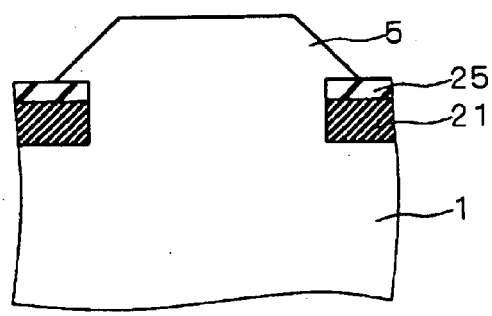

Next, the epitaxial silicon layer 5 is formed in the active region formation opening 4 by selective epitaxial growth (FIG. 38). In this process, the epitaxial silicon layer 5 is formed to a sufficient height in the active region formation opening 4 (to a level higher than the surface level of the stacked film, e.g. to a film thickness about twice that of the stacked film). Accordingly the epitaxial silicon layer 5 is somewhat formed also on the stacked film.

Figure 39:
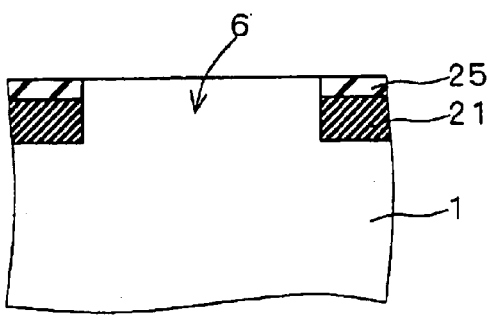

Subsequently, the surface undergoes etchback or CMP for planarization of the surface of the epitaxial silicon layer 5 (FIG. 39). The active region formation silicon layer 6 is thus formed in the active region formation opening 4. The silicon oxynitride film 25 has a smaller etch rate and a smaller polish rate than the epitaxial silicon layer 5. Accordingly, during this planarization process, the silicon oxynitride film 25 can be used as an etching stopper or a polishing stopper by taking advantage of the etch selectivity or polish selectivity between the epitaxial silicon layer 5 and the silicon oxynitride film 25. This prevents excessive planarization of the epitaxial silicon layer 5.

After the planarization process, the surface of the epitaxial silicon layer 5 is at the same level as, or somewhat lower than, the top surface of the silicon oxynitride film 25. The difference between the top surface of the silicon oxynitride film 25 and the surface of the epitaxial silicon layer 5 can be about 0 to −20 nm, for example.

Figure 40:
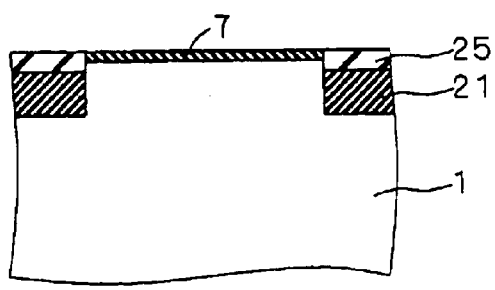
Figure 41:
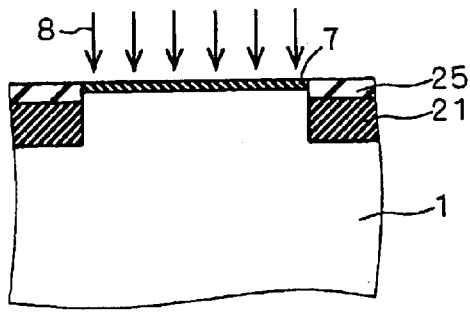

Next, thermal oxidation is applied to the surface of the active region formation silicon layer 6 to form the sacrificial silicon oxide film 7 (FIG. 40). Then the ion implantation 8 for well and channel formation is applied through the sacrificial silicon oxide film 7 (FIG. 41).

Figure 42:
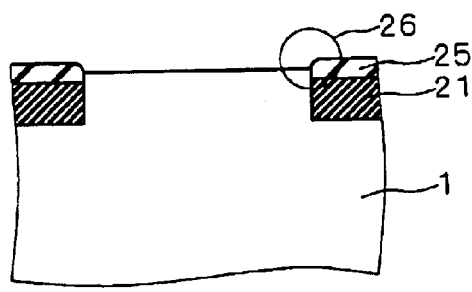

Then the sacrificial silicon oxide film 7 is removed by wet etching using HF (FIG. 42). In the element isolation regions, the silicon oxynitride film 25, which is located on the surface side away from the semiconductor substrate 1, has a smaller etch rate than the sacrificial silicon oxide film 7. Accordingly, during the removal of the sacrificial silicon oxide film 7, recesses will not be formed by the etching in the vicinities of the edges 26 of the element isolation regions. As a result, when a gate electrode is formed on the surface of the active region formation silicon layer 6, the gate electrode is not formed in acute angles on the element isolation regions, and a semiconductor device less likely to suffer the inverse narrow channel effect can thus be manufactured.

After that, a silicon oxide film and a polycrystalline silicon film are formed on the surface of the semiconductor substrate 1, which are then patterned to form the gate oxide film 10 and the gate electrode 12 of the MOS transistor (FIG. 43). The semiconductor device of this preferred embodiment is thus obtained.

The semiconductor device of this preferred embodiment adopts, as the element isolation regions, the stacked film that has on its surface side the silicon oxynitride film 25 having a smaller etch rate than the sacrificial silicon oxide film 7. This prevents formation of recesses in the stacked film, as shown in FIG. 44, during the removal of the sacrificial silicon oxide film 7. Thus the strength of the electric field 27a at the gate edge is weakened.

Weakening the strength of the electric field 27a suppresses the inverse narrow channel effect, so that the MOS transistor offers a characteristic closer to that shown by the graph GR1 in FIG. 77. This preferred embodiment thus enables the manufacture of an MOS transistor having a good characteristic.

Furthermore, in the case of the silicon oxynitride film 25, as shown in FIG. 44, the edges of the element isolation regions are likely to be rounded during the etching to the sacrificial silicon oxide film 7. This structure further prevents the inverse narrow channel effect.

Furthermore, in this preferred embodiment, the silicon oxynitride film 25 resides in the upper layer in the element isolation regions. Therefore the semiconductor substrate 1 is subjected to reduced stress.

The silicon oxide film 21 is an undoped silicon oxide film in which no impurity is implanted, and a refractive index of 1.7 or greater, and smaller than 2.0, is satisfactory for the silicon oxynitride film 25. Then the silicon oxynitride film 25 offers a smaller etch rate with respect to HF, so that recesses are still less likely to be formed in the element isolation regions during the removal of the sacrificial silicon oxide film 7 with HF.

For example, when HF diluted by water of 50 times is used, the silicon oxide film offers an etch rate of about 7.5 nm and a silicon oxynitride film having a refractive index of 1.7 offers an etch rate of about 5.5 nm. That is to say, when the amount of etch of the silicon oxide film is 20 nm, the amount of etch of the silicon oxynitride film is approximately 15 nm.

The process of this preferred embodiment requires that the side walls of the active region formation silicon layer 6 be not exposed after the sacrificial silicon oxide film 7 has been etched. If they are exposed, it means that recesses are formed in the element isolation regions, which will cause the gate electric fields to concentrate at the edges of the active region formation silicon layer 6.

In order to prevent the side walls of the active region formation silicon layer 6 from being exposed after the etching of the sacrificial silicon oxide film 7, it is desired that, before the formation of the sacrificial silicon oxide film 7 (FIG. 39), the top surface of the silicon oxynitride film 25 protrude by about +5 nm above the surface of the active region formation silicon layer 6. When the sacrificial silicon oxide film 7 is 20 nm in thickness, for example, then the silicon oxynitride film 25 requires a film thickness equal to or greater than a total of 20 nm, i.e. the amount of etch with HF of 15 nm plus the amount of protrusion of 5 nm.

When the silicon oxynitride film 25 has a refractive index of 1.7 or greater, then the amount of etch of the silicon oxynitride film 25 becomes still smaller, so that the side walls of the active region formation silicon layer 6 are less likely to be exposed after the etching of the sacrificial silicon oxide film 7. That is to say, the element isolation regions are still less likely to be recessed.

When the refractive index is 2.0 or more, the silicon oxynitride film 25 is then a silicon nitride film, so that the upper limit of its refractive index is below 2.0.

<Seventh Preferred Embodiment>

This preferred embodiment is a variation of the semiconductor device manufacturing method of the sixth preferred embodiment. An impurity is introduced in the surface-side portion of a silicon oxide film to form a silicon oxynitride film in the surface side of the stacked film. In this preferred embodiment, in particular, nitrogen ions are ion-implanted as the impurity to form the silicon oxynitride film.

FIG. 45 and FIGS. 47 to 53 are diagrams that show the process steps of the semiconductor device manufacturing method of this preferred embodiment. FIG. 54 is a diagram that shows the structure of the semiconductor device of this preferred embodiment and FIG. 55 is a diagram that shows in an enlarged manner the region 31 around the edge of an element isolation region of FIG. 54. FIG. 45 and FIGS. 47 to 55 are all cross-sectional views that show an MOS transistor in the gate width direction.

First, the silicon oxide film 2 is deposited by, e.g. CVD, on the surface of the semiconductor substrate 1 or silicon substrate. Then nitrogen ion implantation 28 is applied to the silicon oxide film 2 so that nitrogen is distributed to a depth of about 50 nm from the surface of the silicon oxide film 2. Subsequently a thermal process is applied to form a silicon oxynitride film 29. FIG. 46 is a diagram that shows the relation between the nitrogen concentration and the implant position in this process step.

The dosage of nitrogen ions at this time can be approximately $1 \times 10^{16}/cm^3$ or higher, for example, and the thermal process is performed at 1000° C. or higher. The stacked film composed of the silicon oxide film 2 and the silicon oxynitride film 29 is formed to a thickness of 300 nm, for example.

Next, the photoresist 3 is applied on the stacked film. Then the opening 3a is formed in the photoresist 3 by photolithography (FIG. 47).

Subsequently, dry etching is selectively applied in the opening 3a by using the photoresist 3 as a mask, so as to remove the part of the stacked film right under the opening 3a, thereby forming the active region formation opening 4 (FIG. 48). This process step also forms the stacked film as the element isolation regions. For example, the isolation width of the element isolation regions (the width of each of the opposing portions of the stacked film) is in the range of 0.1 to several hundred micrometers ($\mu$m), though it depends on the circuit to be constructed.

Figure 49:
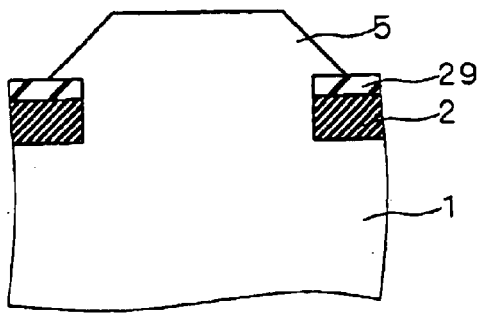

Next, the epitaxial silicon layer 5 is formed in the active region formation opening 4 by selective epitaxial growth (FIG. 49). In this process, the epitaxial silicon layer 5 is formed to a sufficient height in the active region formation opening 4 (to a level higher than the surface level of the stacked film, e.g. to a film thickness about twice that of the stacked film). Accordingly the epitaxial silicon layer 5 is somewhat formed also on the stacked film.

Figure 50:
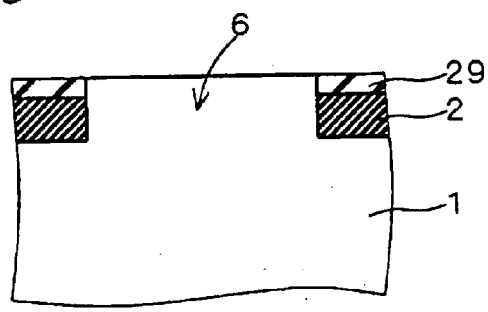

Subsequently, the surface undergoes etchback or CMP for planarization of the surface of the epitaxial silicon layer 5 (FIG. 50). The active region formation silicon layer 6 is thus formed in the active region formation opening 4. The silicon oxynitride film 29 has a smaller etch rate and a smaller polish rate than the epitaxial silicon layer 5. Accordingly, during this planarization process, the silicon oxynitride film 29 can be used as an etching stopper or a polishing stopper by taking advantage of the etch selectivity or polish selectivity between the epitaxial silicon layer 5 and the silicon oxynitride film 29. This prevents excessive planarization of the epitaxial silicon layer 5.

After the planarization process, the surface of the epitaxial silicon layer 5 is at the same level as, or somewhat lower than, the top surface of the silicon oxynitride film 29. The difference between the top surface of the silicon oxynitride film 29 and the surface of the epitaxial silicon layer 5 can be about 0 to −20 nm, for example.

Figure 51:
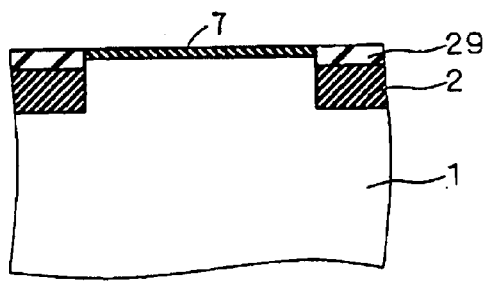
Figure 52:
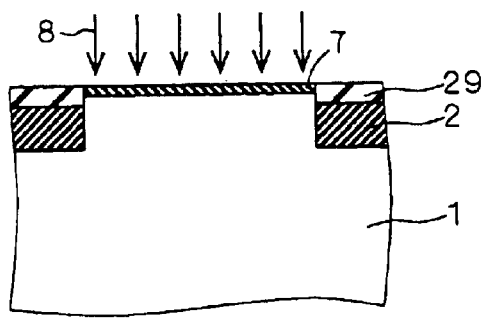

Next, thermal oxidation is applied to the surface of the active region formation silicon layer 6 to form the sacrificial silicon oxide film 7 (FIG. 51). Then the ion implantation 8 for well and channel formation is applied through the sacrificial silicon oxide film 7 (FIG. 52).

Then the sacrificial silicon oxide film 7 is removed by wet etching using HF (FIG. 53). In the element isolation regions, the silicon oxynitride film 29, which is located on the surface side away from the semiconductor substrate 1, has a smaller etch rate than the sacrificial silicon oxide film 7. Accordingly, during the removal of the sacrificial silicon oxide film 7, recesses will not be formed by the etching in the vicinities of the edges 30 of the element isolation regions. As a result, when a gate electrode is formed on the surface of the active region formation silicon layer 6, the gate electrode is not formed in acute angles on the element isolation regions, and a semiconductor device less likely to induce the inverse narrow channel effect can thus be manufactured.

After that, a silicon oxide film and a polycrystalline silicon film are formed on the surface of the semiconductor substrate 1, which are then patterned to form the gate oxide film 10 and the gate electrode 12 of the MOS transistor (FIG. 54). The semiconductor device of this preferred embodiment is thus obtained.

The semiconductor device of this preferred embodiment adopts, as the element isolation regions, the stacked film which has on its surface side the silicon oxynitride film 29 having a smaller etch rate than the sacrificial silicon oxide film 7. This prevents formation of recesses in the stacked film, as shown in FIG. 55, during the removal of the sacrificial silicon oxide film 7. Thus the strength of the electric field 31a at the gate edge is weakened.

Weakening the strength of the electric field 31a suppresses the inverse narrow channel effect, so that the MOS transistor can offer a characteristic closer to that shown by the graph GR1 in FIG. 77. This preferred embodiment thus enables the manufacture of an MOS transistor having a good characteristic.

Furthermore, in the case of the silicon oxynitride film 29, as shown in FIG. 55, the edges of the element isolation regions are likely to be rounded during the etching to the sacrificial silicon oxide film 7. This structure further prevents the inverse narrow channel effect.

Furthermore, in this preferred embodiment, the silicon oxynitride film 29 resides in the upper layer in the element isolation regions. Therefore the semiconductor substrate 1 is subjected to reduced stress.

According to the semiconductor device manufacturing method of this preferred embodiment, nitrogen ions are ion-implanted as an impurity into the silicon oxide film 2, at least in its surface-side portion distant from the semiconductor substrate 1, so as to form the surface-side layer of the stacked film. The silicon oxynitride film 29 that has a smaller etch rate than the sacrificial silicon oxide film 7 can thus be formed in the surface portion.

Accordingly, during the removal of the sacrificial silicon oxide film 7, the element isolation regions are less likely to be recessed by the etching. As a result, when the gate electrode 12 is formed on the surface of the active region formation silicon layer 6, the gate electrode 12 is not formed in acute angles on the element isolation regions, and a semiconductor device less likely to suffer the inverse narrow channel effect can thus be manufactured.

<Eighth Preferred Embodiment>

This preferred embodiment is also a variation of the semiconductor device manufacturing method of the sixth preferred embodiment; an impurity is introduced in the surface-side portion of a silicon oxide film to form a silicon oxynitride film on the surface side of the stacked film. In particular, in this preferred embodiment, a thermal process is performed in an atmosphere which contains nitrogen atoms, so as to form a silicon oxynitride film which contains nitrogen as an impurity.

Figure 65:
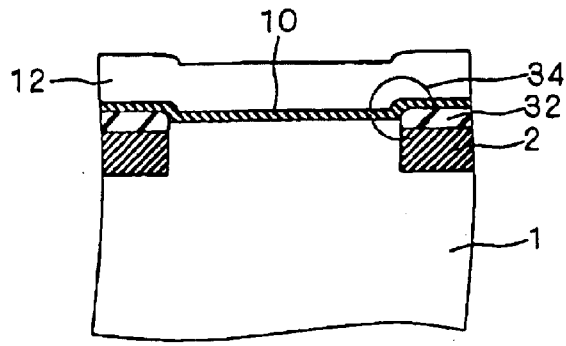
FIG. 65 is a diagram that shows the semiconductor device of the eighth preferred embodiment.
Figure 66:
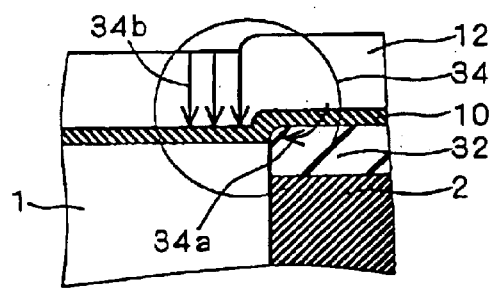
FIG. 66 is a diagram that shows in an enlarged manner a part of the semiconductor device of the eighth preferred embodiment.
Figure 67:
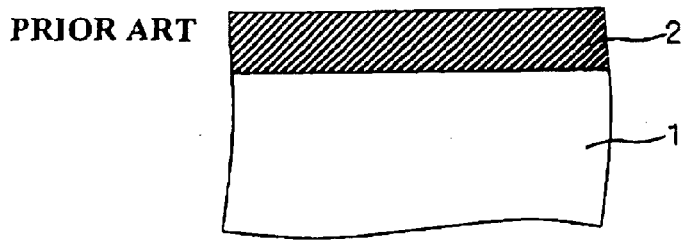
FIGS. 67 to 75 are diagrams that show the process steps of a conventional semiconductor device manufacturing method.
Figure 68:
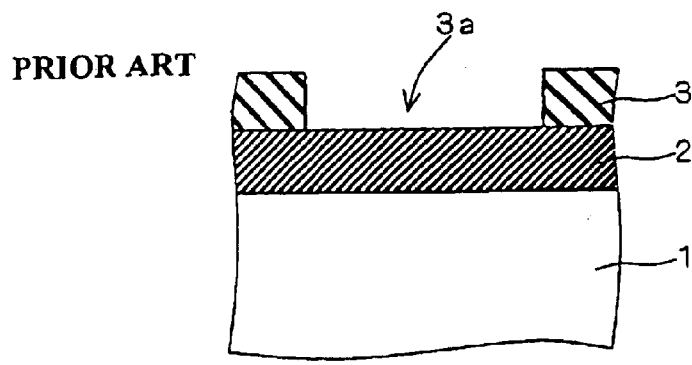
Figure 69:
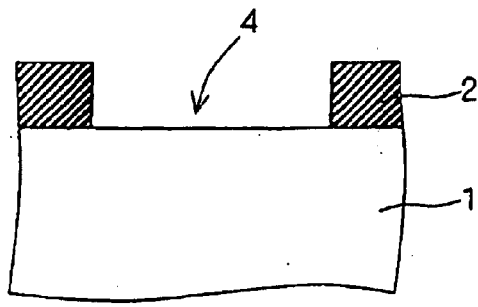
Figure 70:
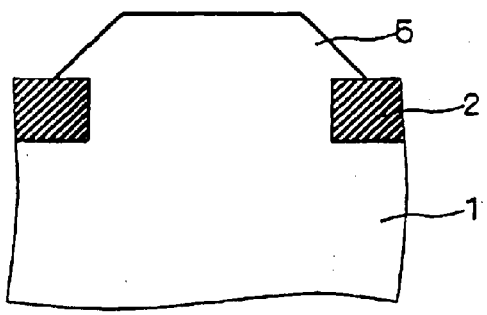
Figure 71:
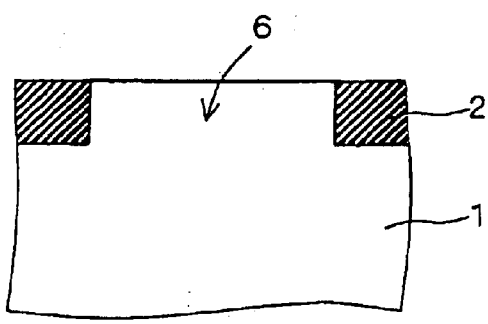
Figure 72:
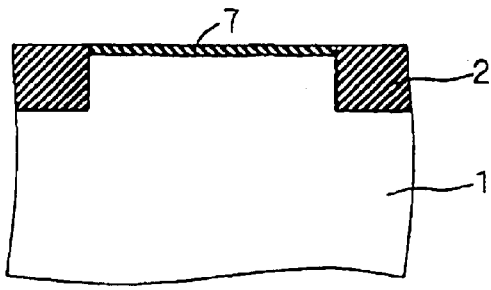
Figure 73:
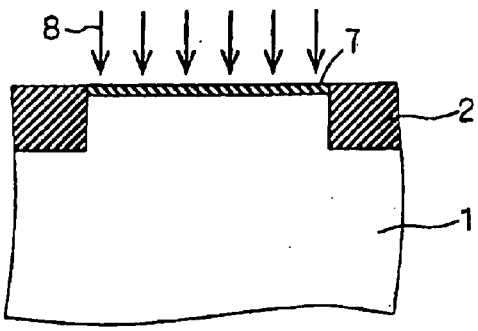
Figure 74:
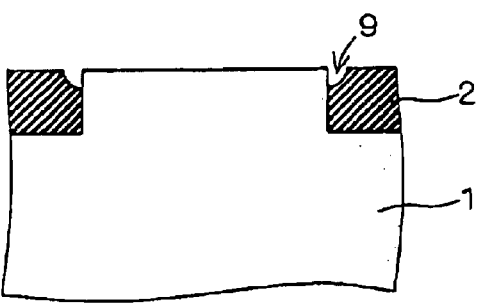
Figure 75:
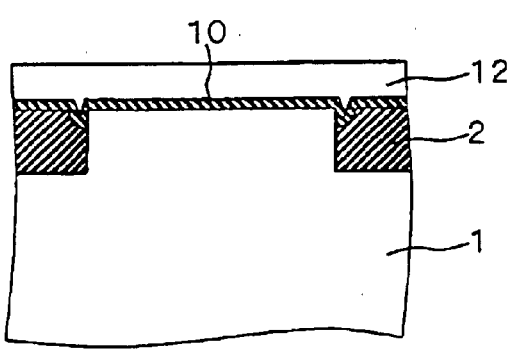
Figure 76:
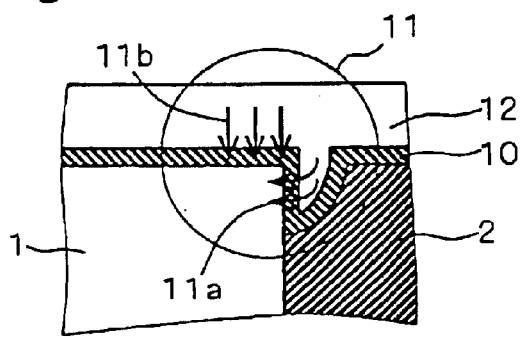
FIG. 76 is a diagram that shows part of the conventional semiconductor device in an enlarged manner.

FIG. 56 and FIGS. 58 to 64 are diagrams that show the process steps of the semiconductor device manufacturing method of this preferred embodiment. FIG. 65 is a diagram that shows the structure of the semiconductor device of this preferred embodiment and FIG. 66 is a diagram that shows in an enlarged manner the region 34 around the edge of an element isolation region of FIG. 65. FIG. 56 and FIGS. 58 to 66 are all cross-sectional views that show an MOS transistor in the gate width direction.

Figure 57:
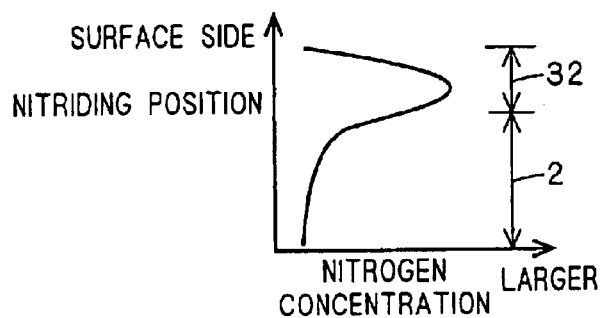
FIG. 57 is a diagram that shows the relation between the nitrogen concentration and the implant position in the semiconductor device of the eighth preferred embodiment.

First, the silicon oxide film 2 is deposited by, e.g. CVD, on the surface of the semiconductor substrate 1 or the silicon substrate. Then a thermal process is applied to the semiconductor substrate 1 on which the silicon oxide film 2 resides, in an atmosphere which contains nitrogen atoms, e.g. a nitrogen atmosphere or an ammonia atmosphere. A silicon oxynitride film 32 which contains nitrogen as an impurity is thus formed. Nitrogen is distributed to a depth of about 50 nm from the surface of the silicon oxide film 2, to form the silicon oxynitride film 32. FIG. 57 is a diagram that shows the relation between the nitrogen concentration and the nitriding position in this process step.

For the formation of the silicon oxynitride film 32, the thermal process is performed at 1000° C. or higher, for example. The stacked film composed of the silicon oxide film 2 and the silicon oxynitride film 32 is formed to a thickness of 300 nm, for example.

Figure 58:
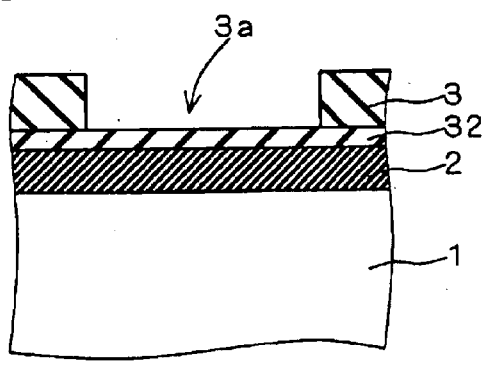
FIGS. 58 to 64 are diagrams that show the process steps of the semiconductor device manufacturing method of the eighth preferred embodiment.

Next, the photoresist 3 is applied on the stacked film. Then the opening 3a is formed in the photoresist 3 by photolithography (FIG. 58).

Figure 59:
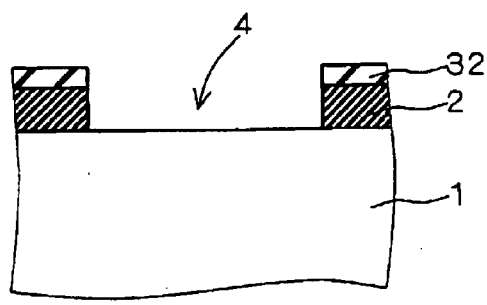

Subsequently, dry etching is selectively applied in the opening 3a by using the photoresist 3 as a mask, so as to remove the part of the stacked film right under the opening 3a, thereby forming the active region formation opening 4 (FIG. 59). This process step also forms the stacked film as the element isolation regions. For example, the isolation width of the element isolation regions (the width of each of the opposing portions of the stacked film) is in the range of 0.1 to several hundred micrometers (μm), though it depends on the circuit to be constructed.

Figure 60:
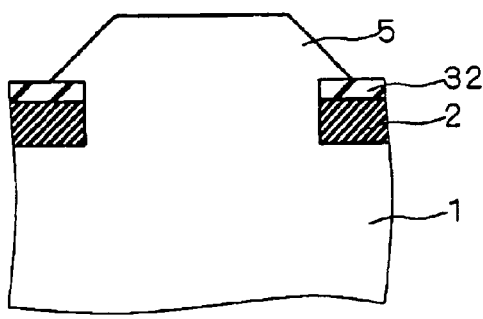

Next, the epitaxial silicon layer 5 is formed in the active region formation opening 4 by selective epitaxial growth (FIG. 60). In this process, the epitaxial silicon layer 5 is formed to a sufficient height in the active region formation opening 4 (to a level higher than the surface level of the stacked film, e.g. to a film thickness about twice that of the stacked film). Accordingly the epitaxial silicon layer 5 is somewhat formed also on the stacked film.

Figure 61:
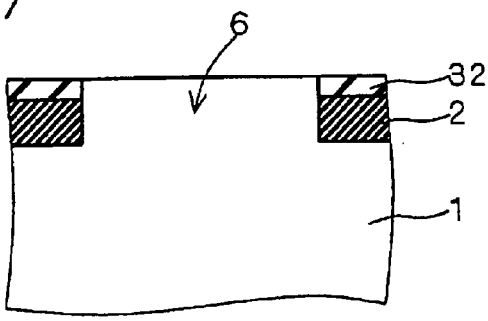

Subsequently, the surface undergoes etchback or CMP for planarization of the surface of the epitaxial silicon layer 5 (FIG. 61). The active region formation silicon layer 6 is thus formed in the active region formation opening 4. The silicon oxynitride film 32 has a smaller etch rate and a smaller polish rate than the epitaxial silicon layer 5. Accordingly, during this planarization process, the silicon oxynitride film 32 can be used as an etching stopper or a polishing stopper by taking advantage of the etch selectivity or polish selectivity between the epitaxial silicon layer 5 and the silicon oxynitride film 32. This prevents excessive planarization of the epitaxial silicon layer 5.

After the planarization process, the surface of the epitaxial silicon layer 5 is at the same level as, or somewhat lower than, the top surface of the silicon oxynitride film 32. The difference between the top surface of the silicon oxynitride film 32 and the surface of the epitaxial silicon layer 5 can be about 0 to −20 nm, for example.

Figure 62:
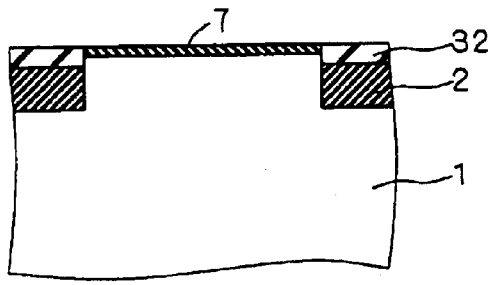
Figure 63:
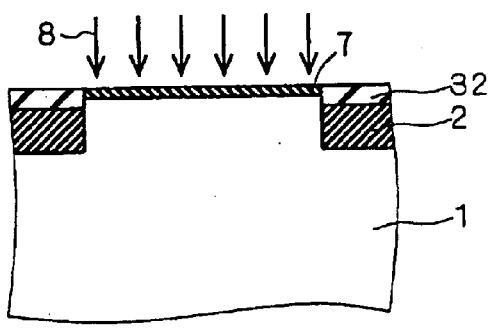

Next, thermal oxidation is applied to the surface of the active region formation silicon layer 6 to form the sacrificial silicon oxide film 7 (FIG. 62). Then the ion implantation 8 for well and channel formation is applied through the sacrificial silicon oxide film 7 (FIG. 63).

Figure 64:
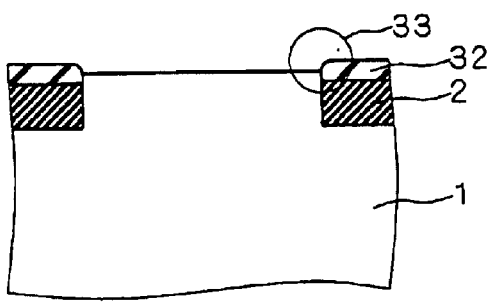

Then the sacrificial silicon oxide film 7 is removed by wet etching using HF (FIG. 64). In the element isolation regions, the silicon oxynitride film 32, which is located on the surface side away from the semiconductor substrate 1, has a smaller etch rate than the sacrificial silicon oxide film 7. Accordingly, during the removal of the sacrificial silicon oxide film 7, recesses will not be formed by the etching in the vicinities of the edges 33 of the element isolation regions. As a result, when a gate electrode is formed on the surface of the active region formation silicon layer 6, the gate electrode is not formed in acute angles on the element isolation regions, and a semiconductor device less likely to induce the inverse narrow channel effect can thus be manufactured.

After that, a silicon oxide film and a polycrystalline silicon film are formed on the surface of the semiconductor substrate 1, which are then patterned to form the gate oxide film 10 and the gate electrode 12 of the MOS transistor (FIG. 65). The semiconductor device of this preferred embodiment is thus obtained.

The semiconductor device of this preferred embodiment adopts, as the element isolation regions, the stacked film that has on its surface side the silicon oxynitride film 32 that has a smaller etch rate than the sacrificial silicon oxide film 7. This prevents formation of recesses in the stacked film, as shown in FIG. 66, during the removal of the sacrificial silicon oxide film 7. Thus the strength of the electric field 34a at the gate edge is weakened.

Weakening the strength of the electric field 34a suppresses the inverse narrow channel effect, so that the MOS transistor can offer a characteristic closer to that shown by the graph GR1 in FIG. 77. This preferred embodiment thus enables the manufacture of an MOS transistor having a good characteristic.

Furthermore, in the case of the silicon oxynitride film 32, as shown in FIG. 66, the edges of the element isolation regions are likely to be rounded during the etching to the sacrificial silicon oxide film 7. This structure further prevents the inverse narrow channel effect.

Furthermore, in this preferred embodiment, the silicon oxynitride film 32 resides in the upper layer in the element isolation regions. Therefore the semiconductor substrate 1 is subjected to reduced stress.

According to the semiconductor device manufacturing method of this preferred embodiment, a thermal process is performed in an atmosphere that contains nitrogen atoms, so as to form a silicon oxynitride film that contains nitrogen as an impurity, at least in the surface-side portion of the silicon oxide film 2 that is distant from the semiconductor substrate 1. The silicon oxynitride film 32, which has a smaller etch rate than the sacrificial silicon oxide film 7, can thus be formed in the surface portion.

Accordingly, during the removal of the sacrificial silicon oxide film 7, recesses are less likely to be formed by the etching in the element isolation regions. As a result, when the gate electrode 12 is formed on the surface of the active region formation silicon layer 6, the gate electrode 12 is not formed in acute angles on the element isolation regions, and a semiconductor device less likely to induce the inverse narrow channel effect can thus be manufactured.

<Ninth Preferred Embodiment>

This preferred embodiment is a variation of the semiconductor device manufacturing method of the seventh or eighth preferred embodiment; the silicon oxynitride film 17 of the third preferred embodiment is formed in the element isolation regions in place of the silicon oxide film 2, and nitrogen is introduced into its upper layer as an impurity. Nitrogen may be introduced by ion implantation as in the seventh preferred embodiment, or by thermal process as in the eighth preferred embodiment.

In this preferred embodiment, the silicon oxide film 2 shown in FIG. 45 and FIGS. 47 to 55 and FIG. 56 and FIGS. 58 to 66 is just replaced by the silicon oxynitride film 17; therefore no drawing is shown.

When the silicon oxide film 2 is replaced by the silicon oxynitride film 17, the element isolation regions are formed of a silicon oxynitride film in which the nitrogen concentration is higher in the surface-side portion away from the semiconductor substrate 1 than in its portion closer to the semiconductor substrate 1. Then, the sacrificial silicon oxide film 7 is formed in the surface of the active region formation silicon layer 6, ion implantation is applied through the sacrificial silicon oxide film 7, and the sacrificial layer is removed by etching, and recesses are less likely to be formed by the etching in the element isolation regions.

As a result, when the gate electrode 12 is formed on the surface of the active region formation silicon layer 6, the gate electrode is not formed in acute angles on the element isolation regions, and a semiconductor device less likely to induce the inverse narrow channel effect can thus be obtained.

Furthermore, as compared with the silicon oxide film, the silicon oxynitride film has a thermal expansion coefficient closer to that of silicon. Therefore the stress to the silicon substrate can be smaller than when the silicon oxide film is used.

While the invention has been described in detail, the foregoing description is in all aspects illustrative and not restrictive. It is understood that numerous other modifications and variations can be devised without departing from the scope of the invention.

What is claimed is:

1. A semiconductor device, comprising:

a semiconductor substrate;

element isolation regions having a silicon nitride film provided in contact with said semiconductor substrate; and a semiconductor layer formed by epitaxial growth in a region interposed between said element isolation regions on said semiconductor substrate.

2. A semiconductor device, comprising:

a semiconductor substrate;

element isolation regions having a silicon oxynitride film provided in contact with said semiconductor substrate; and a semiconductor layer formed by epitaxial growth in a region interposed between said element isolation regions on said semiconductor substrate.

3. A semiconductor device comprising:

a semiconductor substrate;

element isolation regions provided on said semiconductor substrate;

a semiconductor layer formed by epitaxial growth in a region interposed between said element isolation regions on said semiconductor substrate; and said element isolation regions including a stacked film having a silicon oxide film provided on said semiconductor substrate and a silicon nitride film provided on said silicon oxide film; and said silicon nitride film having a refractive index of 2.0 or more.

4. A semiconductor device comprising:

a semiconductor substrate;

element isolation regions provided on said semiconductor substrate;

a semiconductor layer formed by epitaxial growth in a region between said element isolation regions on said semiconductor substrate;

said element isolation regions including a stacked film having an undoped silicon oxide film provided on said semiconductor substrate and a silicon oxynitride film provided on said undoped silicon oxide film; and said silicon oxynitride film having a refractive index of 1.7 or more, and less than 2.0.

5. A semiconductor device comprising:

a semiconductor substrate;

element isolation regions provided on said semiconductor substrate; and a semiconductor layer formed by epitaxial growth in a region between said element isolation regions on said semiconductor substrate;

said element isolation regions including a silicon oxynitride film provided in contact with said semiconductor substrate, said silicon oxynitride film having a higher nitrogen concentration in a surface-side portion which is distant from said semiconductor substrate than in a portion on a semiconductor substrate side.

* * * * *